United States Patent [19]
Mittal

[11] Patent Number: 5,692,910
[45] Date of Patent: Dec. 2, 1997

[54] PRINTED-CIRCUIT BOARD FOR USE WITH CARD-EDGE CONNECTOR AND METHOD

[75] Inventor: Faquir C. Mittal, Audubon, Pa.

[73] Assignee: General Instrument Corporation, Hatboro, Pa.

[21] Appl. No.: 447,451

[22] Filed: May 23, 1995

[51] Int. Cl.⁶ .................................................. H01R 9/09
[52] U.S. Cl. ........................... 439/59; 439/924.1; 439/951
[58] Field of Search .................................... 439/924.1, 951, 439/59, 60

[56] References Cited

U.S. PATENT DOCUMENTS

| | | |
|---|---|---|
| 3,432,795 | 3/1969 | Jayne ............................. 439/924.1 X |
| 3,522,485 | 8/1970 | DeMetrick . |
| 3,973,817 | 8/1976 | Stalley et al. . |
| 4,095,866 | 6/1978 | Merrill . |
| 4,717,218 | 1/1988 | Ratcliff . |
| 4,849,944 | 7/1989 | Matsushita . |
| 5,184,961 | 2/1993 | Ramirez et al. . |
| 5,236,372 | 8/1993 | Yunoki et al. . |
| 5,281,148 | 1/1994 | Thompson . |
| 5,308,248 | 5/1994 | Davidge et al. ............................. 439/59 |
| 5,319,523 | 6/1994 | Ganthier et al. . |

OTHER PUBLICATIONS

Price and Schwartz, "Circuit Board with Angular Contact Finger Section for Insertion in Connector", Jul. 1983, pp. 19 & 20.

*Primary Examiner*—Jes F. Pascua
*Attorney, Agent, or Firm*—Volpe and Koenig, P.C.

[57] ABSTRACT

A PC board for mating with a card-edge connector having a selectively configured projecting tab which defines a desired insertion force profile to facilitate engagement. A portion of the projecting tab is notched to delay the initial contact from the internal spring contacts of the mating card-edge connector until a proportional amount of contacts have opened and wiped some of the PC board terminals first, and then to allow the remaining contacts to engage the notched portion. Initial insertion force is relieved in proportion to the PC board edge profile.

7 Claims, 5 Drawing Sheets

PRINTED-CIRCUIT BOARD FOR USE WITH CARD-EDGE CONNECTOR AND METHOD

BACKGROUND OF THE INVENTION

1. Field Of The Invention

This invention relates generally to PC (printed-circuit) boards with a plurality of electrical contacts aligned at one edge of the board. More particularly, the invention relates to reducing the initial insertion force of a PC board into a mating PC board card-edge connector.

2. Description Of The Related Art

PC boards are well known in the art and are routinely used in computers, aircraft, automobiles and military electronics where high reliability is desired. Regardless the type and design of a PC board, external signal and power connections must be made. One method used most often when modular assembly or high density packaging is necessary is the use of a card-edge connector into which a preformed edge of the PC board is inserted.

To mate with a card-edge connector, PC boards are generally preformed with a rectangular projecting tab along one side having a width and height selectively sized to fit within the socket of the card-edge connector of a predetermined size. An array of contact terminals are silkscreened onto a PC board edge along with the circuit traces during the circuit layout. A typical card-edge connector configuration will have 20 terminals on each side of the PC board. The number of contacts depends upon the number of external board connections required. However, the size of the rectangular projection tab is designed to conform with the internal dimensions of the connector, irrespective of the number connections required. For example, a PC motherboard may include an array of multipurpose card-edge connectors of the same size into which a variety of special purpose circuit boards are inserted, such as a memory card, a modem, etc. Each such special purpose board may have different connection requirements and a different number of contacts. However, all of the special purpose boards typically have the same size rectangular projection tab.

While the rectangular profile of the projecting circuit board tab is a standard industry configuration, there have been special circuit boards designed with a different edge configuration.

A non-soldered connection, such as the card-edge connector and mating contact terminals located on the rectangular projection, must have a gas-tight seal such as that created by a mechanical metal-to-metal wiping action with the seal being left undisturbed. Joints that are not gas-tight will oxidize and ultimately fail. To avoid contact failure, card-edge connectors typically contain gold-plated, bifurcated contacts, in conjunction with a good mechanical design which ensures firm contact pressure during contact wiping and secures the PC board after insertion.

The mechanical design can cause other unrelated problems. The force required to insert a typical PC board into a card-edge connector may be substantial, since the insertion requires overcoming the compressive force of every contact within the card-edge connector simultaneously. This can lead to torsion within the PC board material with concomitant circuit trace, solder, and electronic component lead open circuits as well as injury to the person. Therefore, it is desirable to reduce or eliminate any insertion force.

For example, U.S. Pat. No. 5,236,372 to Yunoki et al. discloses a zero-insertion force connector assembly comprising a female connector with deformable contact members. The deformable contact members within the connector engage corresponding contacts on the PC board when a float member is inserted.

The Yunoki et al. patent is representative of the teachings of the art of zero-insertion force card-edge connectors. Insertion force is reduced to zero by operation of the card-edge connector with the PC board card-edge profile remaining constant throughout the variations.

It would be desirable to provide a method to reduce the initial insertion force of PC boards while utilizing standard PC board card-edge connectors.

SUMMARY OF THE INVENTION

The present invention provides a PC board for mating with a card-edge connector having a selectively configured projecting tab which defines a desired insertion force profile to facilitate engagement. A portion of the projecting tab is notched to delay the initial contact from the internal spring contacts of the mating card-edge connector until a proportional amount of contacts have opened and wiped some of the PC board terminals first, and then to allow the remaining contacts to engage the notched portion. Initial insertion force is relieved in proportion to the PC board edge profile.

Accordingly, it is an object of the present invention to provide a PC board for reducing the initial insertion force into a mating card-edge connector.

Other objects and advantages of the method will become apparent to those skilled in the art after reading the detailed description of the preferred embodiment.

DETAILED DESCRIPTION OF THE PREFERRED EMBODIMENT

Figure 1:
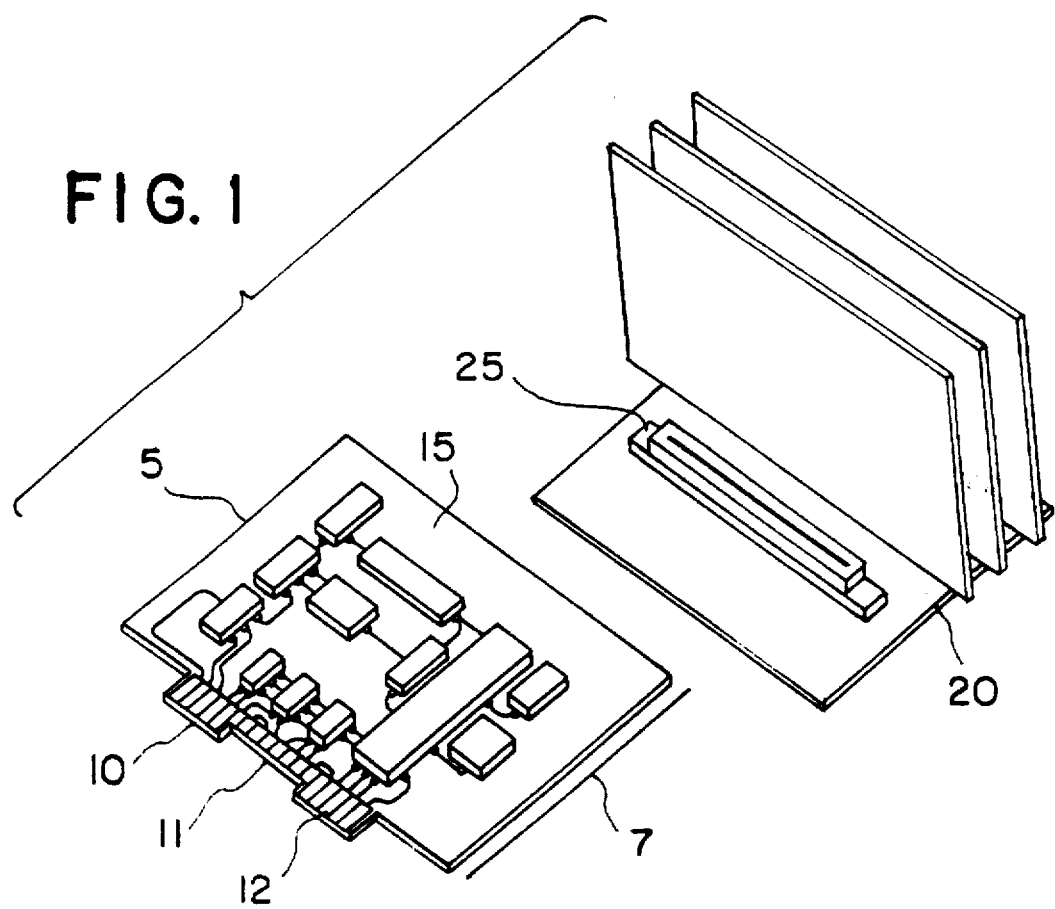
FIG. 1 is an isometric view of the present invention with associated components.

Referring to FIG. 1, there is shown a PC board 5 having a main body 7 with electronic components 15 mounted thereon. A projecting tab 10 is defined along one edge of the PC board 5. The tab 10 has a plurality of contacts 12 in parallel alignment and is part of the PC board 5. A notched area 11 having the selective profile of the preferred embodiment is shown. In this figure, the PC board 5 is used in conjunction with a card-edge connector 25 soldered onto a PC motherboard 20.

Figure 2:
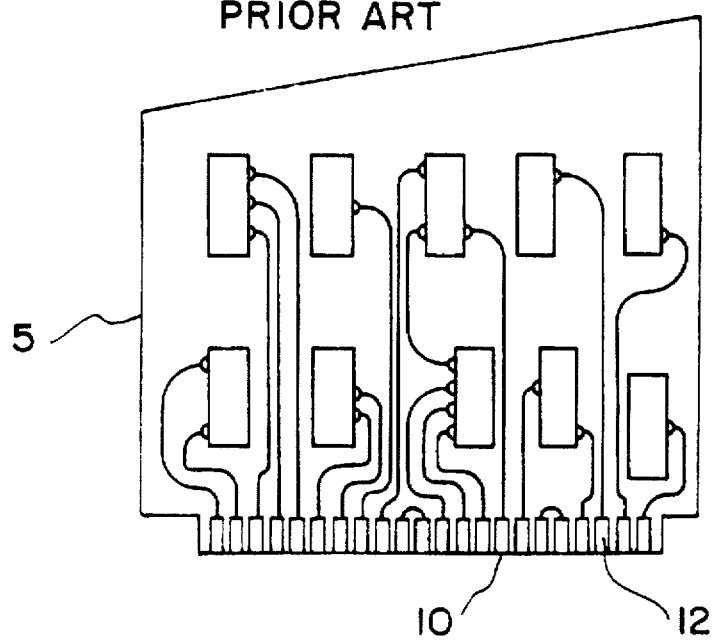
FIG. 2 is a plan view of a prior art PC board.

A prior art PC board having a projecting tab 10 with a plurality of contacts 12 is shown in FIG. 2. All of the contacts 12 are equal in length with an entry end residing in the same plane.

Figure 3:
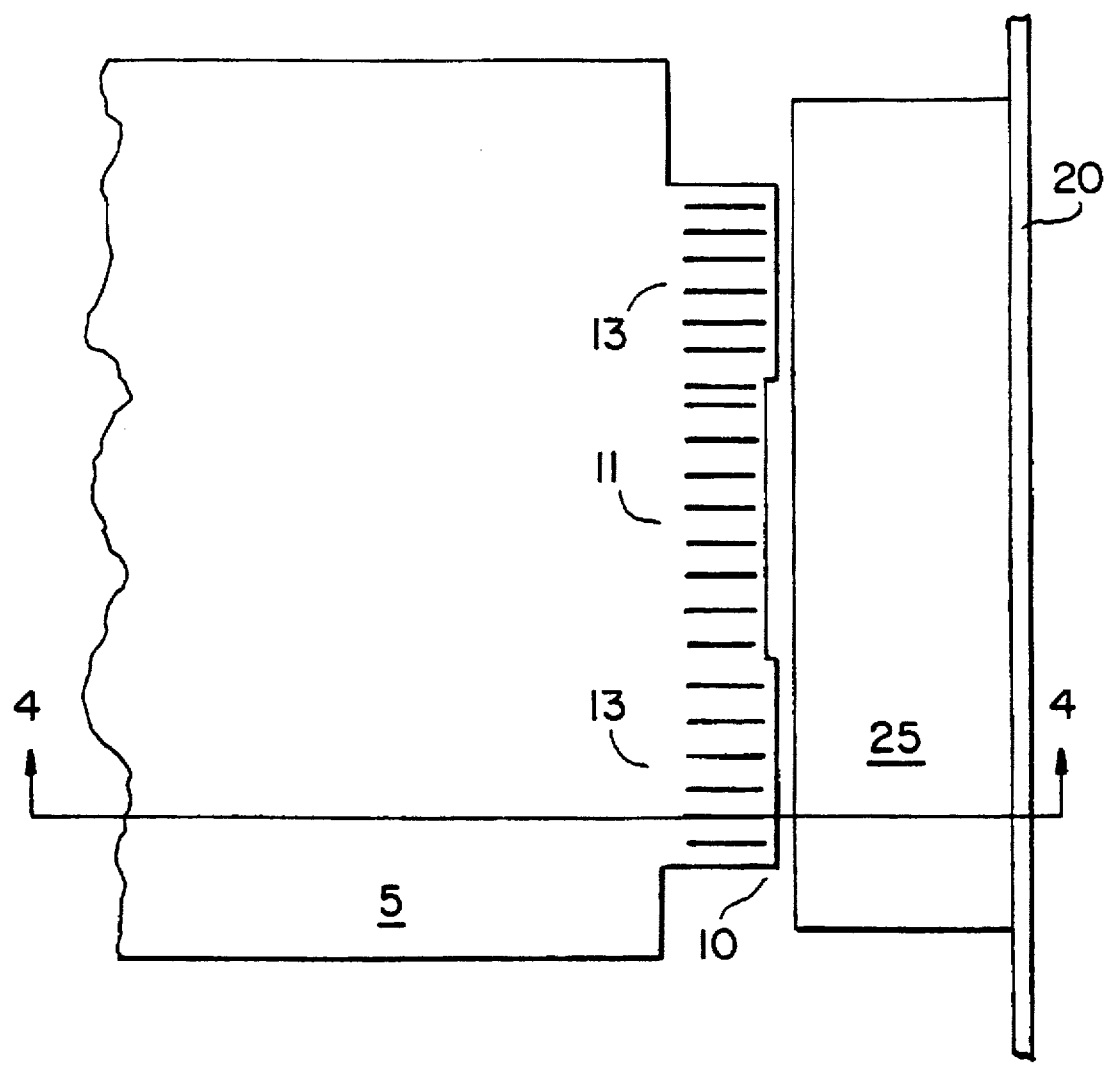
FIG. 3 is a plan view of the present invention.

The preferred embodiment is shown in FIG. 3. The PC board 5 is shown just prior to insertion into a card-edge connector 25. The PC board projecting tab 10 has total width of 2.0 inches with a notched area 11 approximately 1.0 inch in length and 0.07 inch in depth. Two end portions of the projecting tab 13 comprise the remainder of the projecting tab width and have a projection dimension greater than the insertion depth of the card-edge connector 25.

Figure 4:
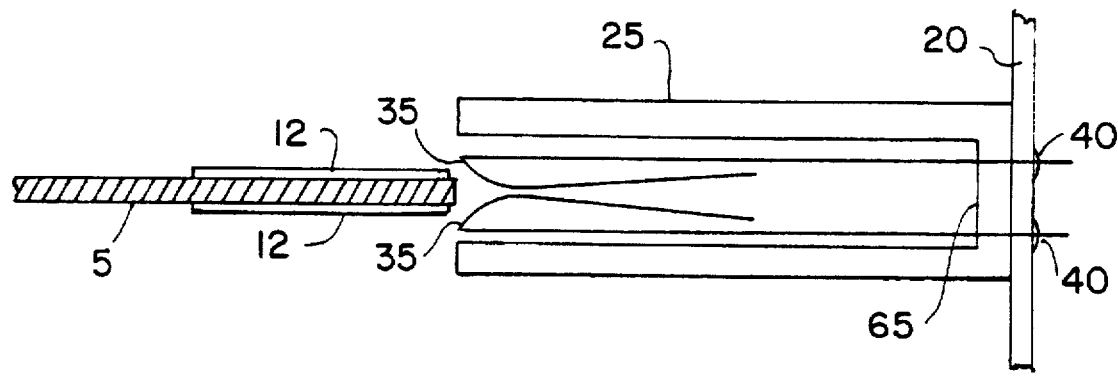
FIG. 4 is a section view along line 4—4 in FIG. 3.

FIG. 4 shows the section view of the PC board 5 in alignment with a mating card-edge connector 25. The internal contacts 35 with associated solder tabs 40 of the card-edge connector 25 are shown prior to engagement. As the PC board 5 is inserted into the mating card-edge connector 25, internal contacts 35 open, thereby compressing and wiping contacts 12 as the insertion progresses.

Figure 5:
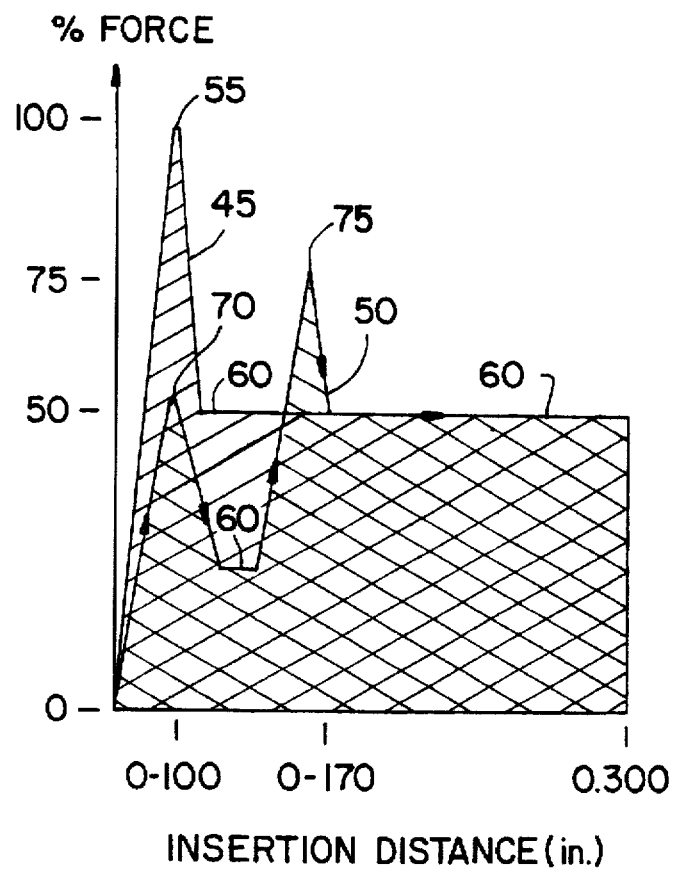
FIG. 5 is a plot of insertion force vs. insertion distance.

Referring to FIG. 5, a comparison plot of insertion force versus insertion distance is shown. The area under curve 45 represents the total force necessary to insert a prior art PC board having no notch as shown in FIG. 2. The area under curve 50 represents the force necessary to insert the preferred embodiment as shown in FIG. 3.

The prior art PC board engages all of the card-edge connector contacts 35 simultaneously, thereby requiring 100% force 55 at a distance of 0.100 inches of travel. Thereafter, the only remaining insertion resistance is the frictional component 60 of the card-edge connector contacts 35 wiping the PC board contacts 12 until the PC board is fully seated against stop 65.

The preferred embodiment PC board as shown in FIG. 3 engages 50% of the card-edge connector contacts 35 at a first time requiring 50% of the force 70 at a distance of 0.100 inches of travel into the connector. Thereafter, the remaining contacts 12 connector fingers engage at a distance of 0.170 inches of travel requiring 75 % of the force 75. The only remaining resistance is the frictional component 60 of the card-edge connector contacts 35 wiping the PC board contacts 12 until the PC board 5 is fully seated against stop 65.

The insertion forces plotted in FIG. 5 are compared as shown in Table 1. The comparison is of PC board having 40 contacts on the projecting tab being inserted into a mating card-edge connector having the same number of contacts. The total insertion depth into the mating card edge connector is 0.300 inches.

TABLE 1

| | Linear percent of force | |
|---|---|---|
| Insertion distance in inches | Prior art PC board edge profile (no notch) | Preferred embodiment PC board edge profile (notched) |
| 0.000 | 0 | 0 |
| 0.100–0.144 | 0–100 | 0–50 |
| 0.145–0.149 | 100–50 | 0–25 |
| 0.150–0.194 | 50 | 25–75 |
| 0.195–0.199 | 50 | 75–50 |
| 0.200–0.300 | 50 | 50 |

The percentage of insertion force will vary depending upon the design of the card-edge connector. The insertion force into a card-edge connector at a given distance can be expressed as the force required to open a pair of contacts, times the number of contacts being opened, plus the force of the opened contacts times the number of contacts opened, times the coefficient of friction.

A notch depth of 0.07 inch was determined to be the optimum distance to allow the contacts residing on the notched portion of the PC board sufficient length or seating area to insure a gas tight seal and adequate area to provide vertical support.

Figure 6:
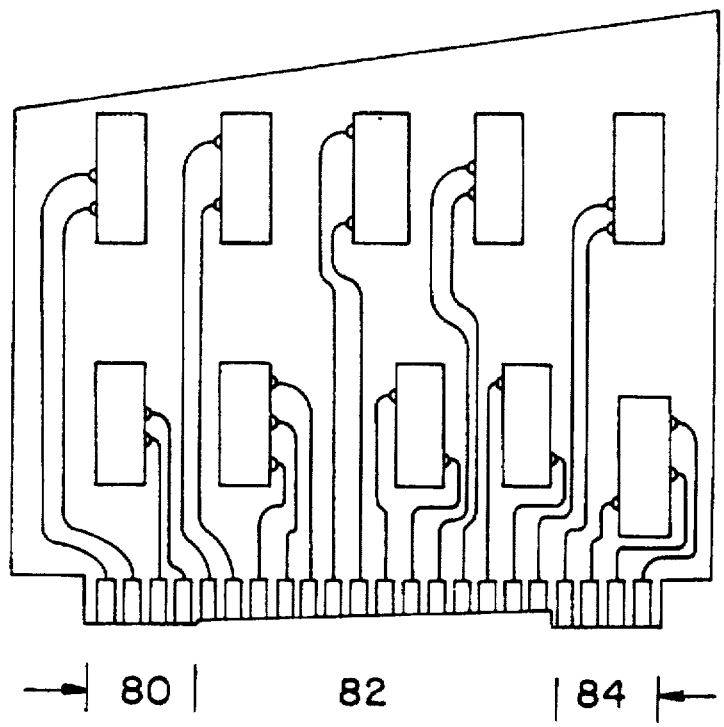
FIG. 6 is a plan view of an alternative embodiment of the instant invention.
Figure 7:
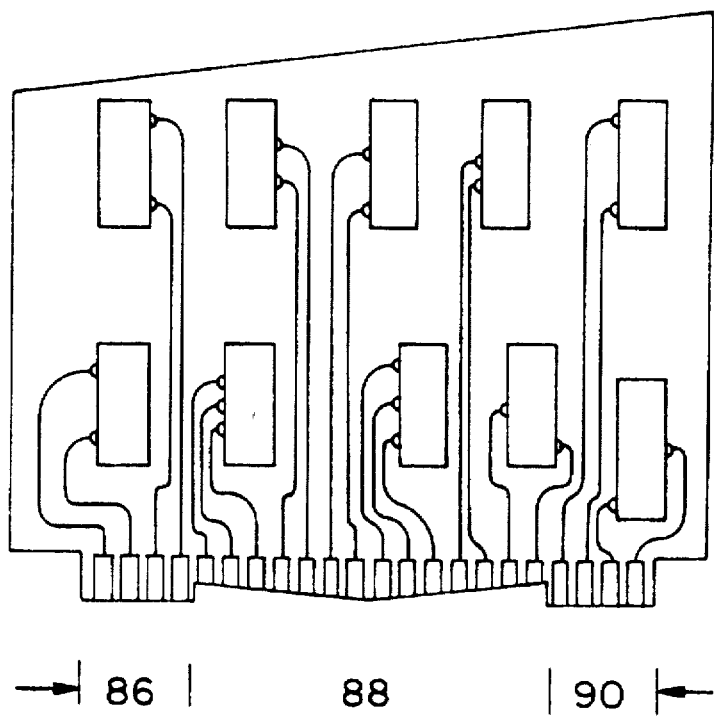
FIG. 7 is a plan view of an alternative embodiment of the present invention.
Figure 8:
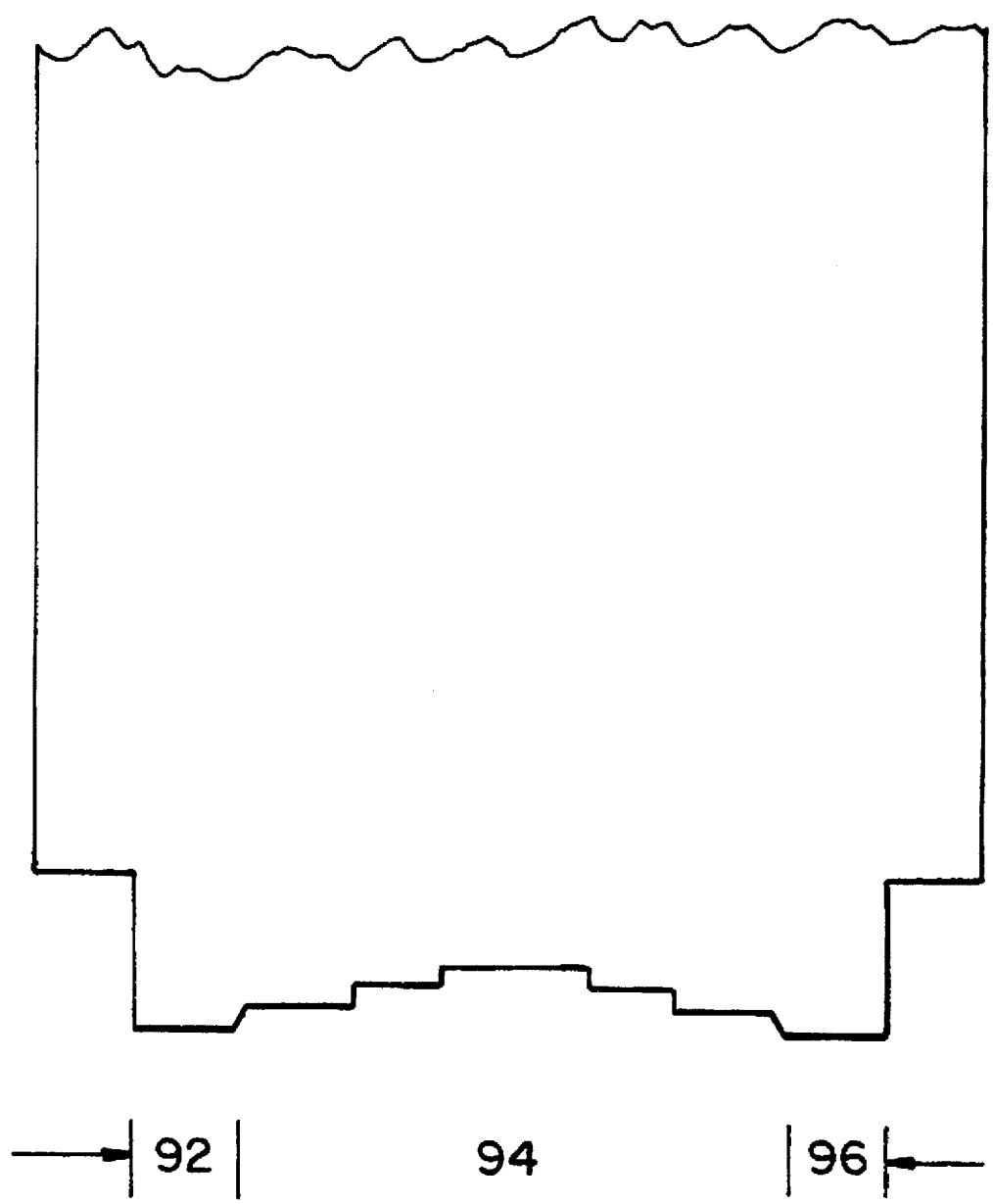
FIG. 8 is a plan view of an alternative embodiment of the present invention.

Three alternative embodiments are show in FIGS. 6, 7 and 8. FIG. 6 shows a card-edge profile having three defined engagement areas. The first 80 and third 84 areas engage first, followed by the second area 82. The second area 82 is inclined in relation to the first 80 and third 84 areas.

A second alternative embodiment, shown in FIG. 7 is similarly defined by three areas 86, 88, and 90. The second area 88 resembles an inverted chevron. The first 86 and third 90 areas engage first.

A third alternative embodiment, shown in FIG. 8 is similarly defined by three areas 92, 94, and 96. The second area 94 has multiple steps. The first 92 and third 96 areas engage first.

Although the invention has been described in part by making detailed reference to certain specific embodiments, such detail is intended to be instructive rather than restrictive. It will be appreciated by those skilled in the art that many variations may be made in the structure and mode of operation without departing from the spirit and scope of the invention as disclosed in the teachings herein.

I claim:

1. A printed circuit board for mating engagement with card-edge connector having a plurality of interior contacts, a predetermined interior width and a predetermined insertion depth, the printed circuit board comprising:

a main board portion upon which electrical circuitry and components are mounted;

a projecting tab having a plurality of parallel contact fingers for electrically coupling with a plurality of the contacts of a card-edge connector having said predetermined characteristics;

said tab having a width which substantially equals the predetermined interior width of the card-edge connector;

said tab having two end portions and a notched portion therebetween;

said two end portions being at least 40 percent and not more than 70 percent of the width of said tab and having a uniform projection dimension which dimension is in excess of the predetermined insertion depth of the card-edge connector and which dimension is also the maximum projection dimension of said tab from said main board portion; and said notched portion of said tab having a portion which projects at least 0.07 inches less than said end portions and configured to define a selected insertion force profile for the insertion of the printed circuit board tab into the card-edge connector.

2. The printed circuit board according to claim 1 wherein said notched portion of said tab has a substantially evenly graded projection profile having two ends, wherein one end of said notched portion is even with one of said tab end portions and the second end projects 0.07 inch less than the other tab end portion.

3. The printed circuit board according to claim 1 wherein said notched portion of said tab is substantially chevron shaped.

4. A method of making a printed circuit board having a projecting tab which includes a plurality of parallel contact fingers for electrically coupling with card-edge connectors having a plurality of interior contacts, a predetermined interior width and a predetermined insertion depth, the projecting tab having a width which substantially equals the predetermined interior width of the card-edge connector comprising the step of:

notching said tab to define two end portions and a notched portion therebetween such that said end portions are at least 40 percent and not more than 70 percent of the width of said tab and have a uniform projection dimension which dimension is in excess of the predetermined insertion depth of the card-edge connector and which dimension is also the maximum projection dimension of said tab from said main board portion and said notched portion of said tab has a portion which projects at least 0.07 inches less than said end portions and is configured to define a selected insertion force profile for the insertion of the printed circuit board tab into the card-edge connector.

5. The method of claim 4 wherein said notching defines the notched portion to have a graduated projection dimension from said main board portion.

6. The method of claim 4 wherein said notching defines the notched portion of said tab to have a substantially chevron shape.

7. The method of claim 4 wherein said notching defines the notched portion of said tab to have multiple steps.

* * * * *

UNITED STATES PATENT AND TRADEMARK OFFICE
CERTIFICATE OF CORRECTION

PATENT NO. : 5,692,910

DATED : December 2, 1997

INVENTOR(S) : Faquir C. Mittal

It is certified that error appears in the above-identified patent and that said Letters Patent is hereby corrected as shown below:

In Claim 1, Column 4, line 21, delete "connector" and insert therefor --connectors--.

Signed and Sealed this

Tenth Day of February, 1998

BRUCE LEHMAN

*Attest:*

*Attesting Officer*     *Commissioner of Patents and Trademarks*